(12) United States Patent
Olvera-Camacho

(10) Patent No.: US 6,432,617 B1
(45) Date of Patent: Aug. 13, 2002

(54) FORMULATIONS OF POSITIVE FILMS

(76) Inventor: Roberto Olvera-Camacho, Suderman No. 213, Desp. 101, Polanco, Delegacion Miguel Hidalgo, Mexico, D. F. 11560 (MX)

( * ) Notice: Subject to any disclaimer, the term of this patent is extended or adjusted under 35 U.S.C. 154(b) by 49 days.

(21) Appl. No.: 09/703,013

(22) Filed: Oct. 31, 2000

Related U.S. Application Data

(62) Division of application No. 09/380,236, filed as application No. PCT/MX98/00009 on Feb. 27, 1998, now Pat. No. 6,168,902.

(30) Foreign Application Priority Data

Feb. 28, 1997 (MX) .............................................. 971592

(51) Int. Cl.$^7$ ................................................. G03F 3/10
(52) U.S. Cl. ........................ 430/293; 430/301; 430/358; 430/365
(58) Field of Search ................................ 430/293, 301, 430/358, 365

(56) References Cited

U.S. PATENT DOCUMENTS

| | | | |
|---|---|---|---|
| 4,217,822 A | 8/1980 | Milligan | |
| 4,908,712 A | 3/1990 | Uchiyama et al. | |
| 5,283,154 A | 2/1994 | Stein | |

FOREIGN PATENT DOCUMENTS

| | | |
|---|---|---|
| EP | 59951 | 9/1982 |
| EP | 91501 | 10/1983 |
| EP | 590921 | 4/1994 |
| WO | 9527923 | 10/1995 |

*Primary Examiner*—Hoa Van Le
(74) *Attorney, Agent, or Firm*—Rosenman & Colin LLP

(57) ABSTRACT

The present invention relates to positive film formulations for obtaining color selection, through the use of balanced primary colors, and the method to obtain the same. Said formulations comprise an emulsion sensitive to any type of light and a photographically accepted vehicle. The thus obtained positive film formulations are suitable to establish trichromatisms and bichromatisms by employing previously balanced primary colors.

9 Claims, 9 Drawing Sheets

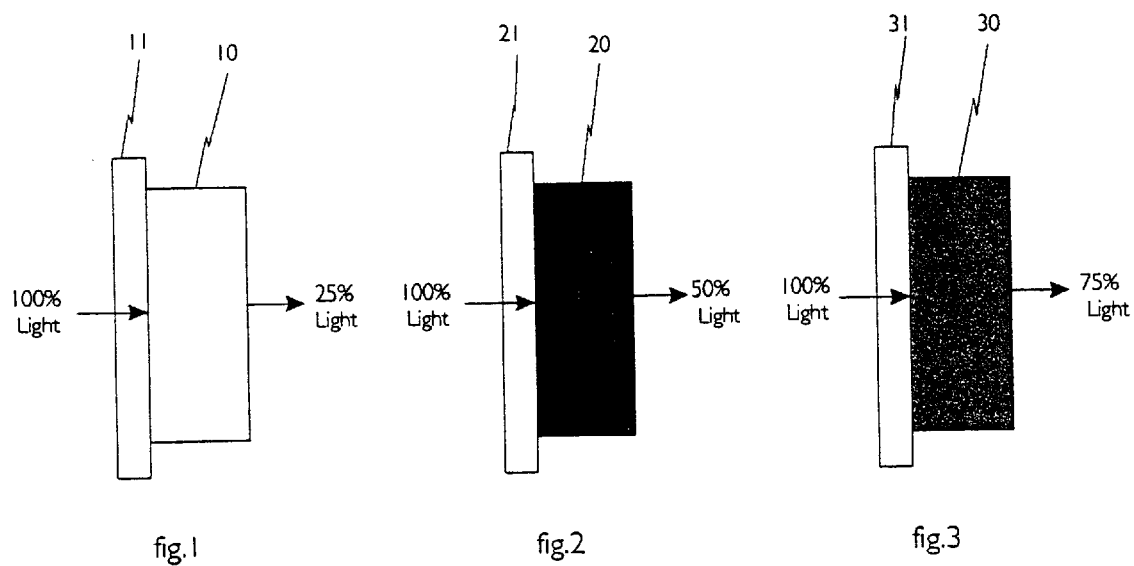

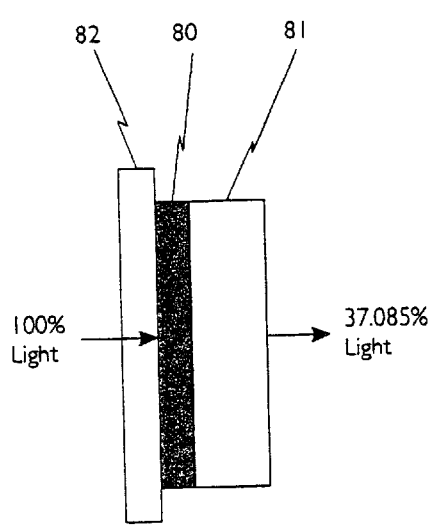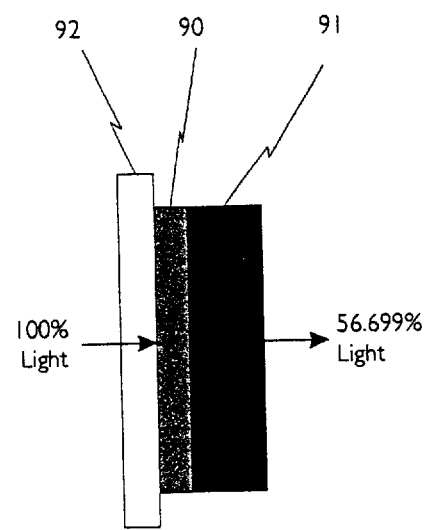
fig.8
fig.9

FORMULATIONS OF POSITIVE FILMS

This is a division of U.S. application Ser. No. 09/380,236 filed Aug. 27, 1999, now U.S. Pat. No. 6,168,902 which is a 371 of PCT/MX98/00009 filed Feb. 27, 1998.

FIELD OF THE INVENTION

The present invention relates to the art of manufacturing and formulating photographic films employed in lithographic industry; and more particularly is related to positive film formulations to make color selection by means of balanced primary colors, and to the method of obtaining said formulations.

BACKGROUND OF THE INVENTION

It is well known in the present state of the art that the basic principle of color printing in the lithographic industry resides in the use of only three primary colors, which results in the illusion of finding in the printed reproduction, the hundreds of colors the human eye is capable of differentiate in the original.

Modern color printing, wherein only three printing inks are used of different colors, was created when the discoveries of photography, half-tone screen, coal tar and synthetic dyes to make transparent color inks, as well as color separation filters were combined to each other. All of these technologies are supported by a better comprehension of the color vision.

All of the commercial color printing processes use a fourth black ink printing, whereby they are considered as processes based on tetrachromatism.

Color printing with inks consists in provide in a controlled manner, red, green and blue light, which is attained in an indirect manner by means of a substractive process.

Printing is carried out with yellow, magenta and cyan dyes, as they are the ideal complementary of blue, green and red colors, respectively; and each is capable of offset the red, green and blue light reflection from the paper surface.

The first step in any color reproduction system is called color separation. This step can be carried out by taking three photographic images of the original, each of them through different red, green or blue filters. Every separation image thus filtered is exposed through a half-tone screen in order to create dots of different sizes to control the tints and values of the different shades.

When these separation images and half-tone screen are simultaneously made on the same photographic film, it is referred to as a direct screen.

In the indirect process, color separation negatives are normal continuous-tone photographic images and the half-tone dots screen is introduced in a second stage, by means of a high-contrast film, in order to create dotted positive images.

It is important to mention that the direct screen method is more economical and, therefore, is the more broadly used.

Nowadays, as already mentioned above, lithographic color printing is made by employing four prints: three of them by using inks corresponding to the three primary colors, and a fourth print by using black ink (tetrachromatism or four-color printing), and to this issue it is necessary that three photographic images are employed of the original to be reproduced by using three different filters, one for every primary color. This means that four photographic films will be required for the lithographic printing, including black color; four processes and the making of four printing sheets, as well as four passes through the printing machine.

In order to make the separation negatives, positive photographic films are presently employed using formulations based on an emulsion sensitive to any type of light, wherein the emulsion used covers the entire range of said three primary colors; whereby each photographic print required for separation of colors has the drawback of not taking advantage of the positive photographic film emulsion in a 100%, as a portion of the emulsion is wasted away, and this impacts directly on the total process cost.

As a consequence from the above, for long it has been sought to overcome the drawbacks of the color printing methods of the state of the art by providing positive film formulations for obtaining color selection by employing balanced primary colors, as well as the method to obtain said formulations; by means of which the printing in a lithographic workshop can become more efficient and economical upon a reduction in the process stages required for the printing, and also upon a reduction in the raw materials required in the manufacture of the positive films employed during the color lithographic printing.

OBJECTS OF THE INVENTION

Having in mind the drawbacks of the prior art, it is an object of this invention to provide positive film formulations for obtaining color selection, by employing balanced primary colors, which facilitate a more efficient color printing in the lithographic industry, upon a reduction in the process stages required to carry out said printing.

It is another object of this invention to provide positive film formulations for obtaining color selection by employing balanced primary colors; by means of which more economical color printings can be made in the lithographic industry, due to the reduction in the number of raw materials required in the manufacture of those positive photographic films employed during the color printing.

It is another further object of this invention to provide a method of obtaining positive film formulations to make the color selection by employing balanced primary colors, by means of which a film formulation can be obtained for the gray equivalent which blocks the same amount of light for each of the primary colors.

It is also another object of this invention to provide a method of obtaining positive film formulations to make color selection, by employing balanced primary colors, by means of which a film formulation can be obtained for the gray equivalent which blocks the same amount of light for a mixture of primary colors.

The above as well as other further objects and advantages of the invention are accomplished by means of the positive film formulations for obtaining color selection, through the use of balanced primary colors; with said formulations comprising an emulsion sensitive to any type of light and a photographically acceptable vehicle; said formulations being obtained through a method basically comprising the obtaining of the gray equivalent for every primary color or a mixture of primary colors; there being obtained said equivalent grays by the application of a color volume calculated as per the following mathematical expression:

$$V = \frac{T^2}{10} \tag{I}$$

wherein:

---

T = the color shade in percentage (%)
V = the color volume in volumetric units.

BRIEF DESCRIPTION OF DRAWINGS

FIG. 1 represents the physical qualities that the "yellow" color must have in order to attain a trichromatism with a 75% density.

FIG. 2 represents the physical qualities that the "magenta" color must have in order to attain a trichromatism with a 50% density.

FIG. 3 represents the physical qualities that the "cyan" color must have in order to attain a trichromatism with a 25% density.

FIGS. 8 and 9 represent the physical qualities that a mixture of yellowish green and magentish violet colors must have in order to obtain a bichromatism (C), with 62.915% and 43.301% densities, respectively.

DETAILED DESCRIPTION

Figure 4:
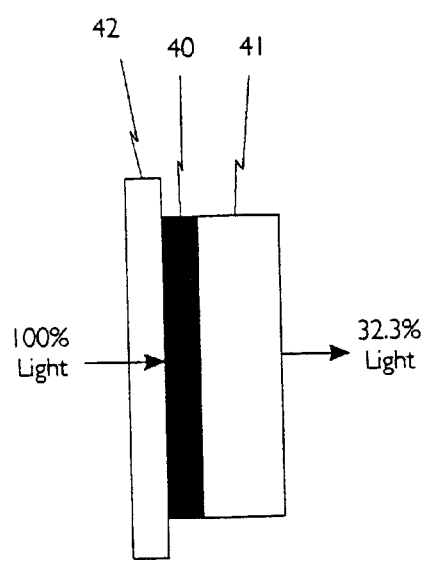
FIGS. 4 and 5 represent the physical qualities that a mixture of yellowish red and cyanish violet colors must have in order to obtain a bichromatism (A), with 67.7% and 35.355% densities, respectively.

Due to the accepted subjective character of color, there are presently problems related to color that until now have not been solved. These problems can be reviewed as follows: a) the establishment of primary colors standards; b) the establishment of film density standards; f) the establishment of the trichromatism (instead of the instant tetrachromatism) and g) the establishment of the bichromatism (instead of the instant tetrachromatism).

With reference to the establishment of primary colors standards, according to the configuration system of the firm "Fuji Color-Art", the combination of said primary colors for North America is Y2+M3+C3; whilst for the European continent is Y1+M2+C2; and for the rest of the world is Y1+M1/M2+C1/C2; wherein:

Y1 and Y2 refer to yellow color, with different shades therebetween;

M1, M2 and M3 refer to magenta color, with different shades therebetween.

C1, C2 and C3 refer to cyan color, with different shades therebetween; and

K1 refers to black color.

The above color shade selection has been established by visual perception methods and through experimental methods to attain the color separation and, thereby, to reproduce satisfactorily a "landscape" same as an original.

Until now it is accepted that it cannot be reproduced a "landscape" exactly same as an original, by means of the offset system and by means of a tetrachromatism; consequently, there is a conformity between printer and client in accepting the reproduction of a "landscape" satisfactorily same as an original.

On the other side, primary colors presently used are of a partial transparency, wherein transparency means the phenomenon that happens when a filter plate is illuminated and the same only allows the pass of a certain amount of light.

The amount of light thus retained is known as "density".

Now then, in order to establish the trichromatism, it is necessary to determine the shades of the primary colors with certain physical qualities allowing the reproduction of a "landscape" exactly same as the original.

In order to define said physical qualities, it is required that the "gray" equivalents, corresponding to each of the three primary colors are found, indicating the physical qualities the positive films (densities) must have so as to obtain three different films, one for each of said primary colors.

With said determinations a reproduction of a "landscape" exactly same as the original can be obtained.

Regarding bichromatism, in order to establish the same it is necessary that the shades of two mixtures of two primary colors with certain physical qualities are determined, thus providing for the reproduction of a "landscape" exactly same as the original.

In order to define said physical qualities, it is required that the "gray" equivalents corresponding to each of said two mixtures of two primary colors are found, indicating the physical qualities the positive films (densities) must have in order to obtain two different films: one for each of the mixtures of said two primary colors.

With these determinations a reproduction of a "landscape" exactly same as the original can be obtained.

In order to establish said bichromatism, three different mixtures of colors are to be considered, to wit: a bichromatism (A), a bichromatism (B) and a bichromatism (C).

Bichromatism (A) sets the physical properties corresponding to yellowish red shades and cyanish violet shades, suitable to obtain the respective positive films thereof.

Bichromatism (B) sets the physical properties corresponding to magentish red shades and cyanish green shades, suitable to obtain the respective positive films thereof.

Bichromatism (C) sets the physical properties corresponding to yellowish green shades and magentish violet shades, suitable to obtain the respective positive films thereof.

Hereinbelow are disclosed some of the economical and operational advantages afforded by the trichromatism and bichromatisms (A), (B) and (C) of this invention, compared to the presently employed tetrachromatism; with said comparation being regarding the savings in a lithography workshop.

| | Presently employed tetrachromatism |
|---|---|
| 4 | films |
| 4 | Processings |
| 4 | Sheets |
| 4 | Processings |
| 4 | Machine passes |

-continued

| | Trichromatism | |
|---|---|---|
| 3 | Films | Savings: 25% |
| 3 | Processings | Savings: 25% |
| 3 | Sheets | Savings: 25% |
| 3 | Processings | Savings: 25% |
| 3 | Machine passes | Savings: 25% |
| | Bichromatism | |
| 2 | Films | Savings: 50% |
| 2 | Processings | Savings: 50% |
| 2 | Sheets | Savings: 50% |
| 2 | Processings | Savings: 50% |
| 2 | Machine passes | Savings: 50% |

Upon comparing the requirements to carry out a tetrachromatism against the requirements for a trichromatism, it is clearly observed that a savings of 25% in every concept is obtained.

Upon comparing the requirements to carry out a tetrachromatism against the requirements for a bichromatism, it is clearly observed that a savings of 50% in every concept is obtained.

The same situation arises in the manufacture of the positive film, where savings per acetate unit, emulsion unit, vehicle unit and manufacture unit can be made.

Now then, in order to obtain the gray equivalent for each of the primary colors, and also to obtain the gray equivalent for the mixture of said three primary colors, it has been surprisingly found through experimentation that a yellow color to 100% shade allows a 25% of light to pass and retains a 75% of light, i. e., it has a 75% density, as shown in FIG. 1; magenta color to 100% shade allows a 50% of light to pass and retains a 50% of light, i. e., it has a 50% density, as shown in FIG. 2; and, cyan color to 100% shade allows a 75% of light to pass and retains a 25% of light, i. e., it has a 25% density, as shown in FIG. 3.

Density data found for each primary color allow that a balance of the three primary colors can be made.

In a lithographic system, any "paint layer" shows to the eye a 100% of its "shade" only when it is deposited as a film with a uniform thickness, onto a white surface.

It is this thickness or film heigth what in this invention has been defined as 1 ROC, to be further discussed hereinbelow.

On the other side, in a lithographic system, a "screen" has the property of showing to the eye the same shade as a paint layer with a thickness corresponding to the percentage of said screen.

To a 100% of a screen corresponds a layer thickness of 1 ROC and to a 0% of a screen corresponds a layer thickness of 0 ROC.

The color obtained through a mixture of primary colors used in a lithographic system is not altered when every part of the mixture is multiplied or divided by the same value.

In FIG. 1 the physical qualities of primary yellow color 10 are represented, with a layer thickness of 1 ROC, as deposited onto a transparent acetate 11. This provides a geometrical pattern of uniform layer and density, equivalent in volume to a parallelepiped with a 75% density, i. e., the amount of light trapped there is 75% and, accordingly, only passes a 25% of the light incident on said transparent acetate 11.

In FIG. 2 the physical qualities for primary magenta color 20 are represented, with a layer thickness of 1 ROC, as deposited onto a transparent acetate 21. This provides a uniform geometrical pattern of layer and density equivalent in volume to a parallelepiped with a 50% density, i. e., the amount of light retained is 50% and, accordingly, only passes a 50% of the light incident on said transparent acetate 21.

In FIG. 3 the physical qualities for primary cyan color 30 are represented, with a layer thickness of 1 ROC, as deposited onto a transparent acetate 31. This provides a uniform geometrical pattern of layer and density equivalent in volume to a parallelepiped with a 25% density, i. e., the amount of light retained is 25% and, accordingly, passes a 75 % of the light incident on said transparent acetate 31.

With these density data the volume of black color is calculated equivalent to 100% of shade retaining a 25% of light for cyan color, the volume of black color equivalent to 100% of shade retaining a 50% of light for magenta color, and the volume of black color equivalent to 100% of shade retaining a 75% of light for yellow color, by applying the equation (I):

$$V = \frac{T^2}{10} \qquad (I)$$

wherein:
T=the shade or color density in percentage (%)
V=the color volume in volumetric units.

In Table I the values obtained upon application of said equation (I) are shown:

TABLE I

| | Density | Volume of black equivalent to 100% shade | Volume of white to 100% volume | Volume of black equivalent fractionally expressed |
|---|---|---|---|---|
| Yellow | 75% | 562.50 | 437.50 | 9/16 |
| Magenta | 50% | 250.00 | 750.00 | 4/16 |
| Cyan | 25% | 62.50 | 937.50 | 1/16 |

The thus found volumes of black and white correspond, upon mixing them, to the gray equivalent for each primary color; in addition to correspond to the amount expressed as fractions of emulsion (black color) and vehicle (white color) that a positive film formulation must contain in order to separate the corresponding primary color during the lithographic process, as shown in Table II:

TABLE II

| | Gray equiv. yellow color | Gray equiv. magenta color | Gray equiv. cyan color |
|---|---|---|---|
| Black | 562.50 | 250.00 | 62.50 |
| White | 437.50 | 750.00 | 937.50 |
| Total volume | 1000.00 | 1000.00 | 1000.00 |
| Emulsion | 9/16 | 4/16 | 1/16 |
| Vehicle | 7/16 | 12/16 | 15/16 |

The present invention formulations comprise basically an emulsion sensitive to any type of light and a photographically acceptable vehicle.

Black color volumes and white color volumes, corresponding to each of the primary colors, can be grouped and added in such a manner as to obtain the percentage volume of black color and the percentage volume of white color corresponding to the gray color equivalent for the mixture of said three primary colors in equal volumes, as appear from the following Table III:

TABLE III

| | Gray equivalent mixture of primary colors at equal volume | Gray equivalent mixture of primary colors based on a volume of 1000 | Gray equivalent mixture of primary colors fractionally expressed |
|---|---|---|---|
| Black | 875.00 | 291.667 | 7/24 |
| White | 2125.00 | 708.333 | 17/24 |
| Total volume | 3000.00 | 1000.000 | 24/24 |

Values of 7/24 for black color (emulsion and 17/24 for white color (vehicle) correspond to the formulation of a positive film corresponding to the gray equivalent of a mixture of said three primary colors at equal volumes.

Now then, in order to establish the gray equivalent for the bichromatism (A), (B) and (C), corresponding also to the amounts of emulsion (black color) and vehicle (white color) a positive film formulation must consist of, in order to be able to separate the mixtures of primary colors corresponding to each of the bichromatism, it is necessary first to establish the different combinations of the three primary colors yellow, magenta and cyan, for every one of the bichromatism (A), (B) and (C), as well as the volume amounts required of said primary colors, in order to be able to obtain the corresponding density or the amount of light each of said bichromatism (A), (B) and (C) retains, as shown in the following Tables IV, V and VI:

TABLE IV

| | BICHROMATISM "A" | |
|---|---|---|
| | Yellowish red | Cyanish violet |
| Yellow | 2/3 volume | — |
| Magenta | 1/3 volume | 1/3 volume |
| Cyan | — | 2/3 volume |

TABLE V

| | BICHROMATISM "B" | |
|---|---|---|
| | Magentish red | Cyanish green |
| Yellow | 1/3 volume | 1/3 volume |
| Magenta | 2/3 volume | — |
| Cyan | — | 2/3 volume |

TABLE VI

| | BICHROMATISM "C" | |
|---|---|---|
| | Yellowish green | Magentish violet |
| Yellow | 2/3 volume | — |
| Magenta | — | 2/3 volume |
| Cyan | 1/3 volume | 1/3 volume |

According to Table IV, in FIG. 4 the physical qualities of the primary colors magenta 40 and yellow 41 mixtures (1/3 of magenta color and 2/3 of yellow color) are represented, forming a layer with a thickness of 1 ROC, of a yellowish red shade, with the mixture deposited onto a transparent acetate 42.

By applying the values obtained for black color volume equivalent, as listed in Table I for magenta color with a 50% density and yellow color with a 75% density, it is obtained:

$$V \text{ magenta} = 250.0 \times 1/3 = 83.3333$$
$$V \text{ yellow} = 562.5 \times 2/3 = 375.0$$
$$V \text{ (magenta + yellow)} = \overline{458.3333}$$

The variable "T" is isolated from equation (I) in order to calculate the shade or density of the magenta and yellow colors mixture, according to the following:

$$T = (10 \times V)^{1/2} \qquad (II)$$

By applying equation II to the summa of magenta and yellow colors volumes, the following is obtained:

$$T = (10 \times 458.3333)^{1/2} = 67.7\%$$

A geometrical pattern of uniform layer and density is thus obtained equivalent in volume to a parallelepiped with a 67.7% density for the bichromatism (A), i. e., the amount of light retained is 67.7% and, accordingly, the amount of light incident on the transparent acetate 42 which passed through the latter is 32.3%.

Figure 5:
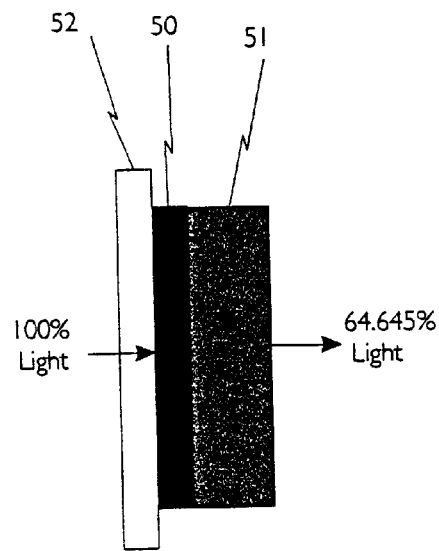

According to Table IV, in FIG. 5 the physical qualities of the primary colors magenta 50 and cyan 51 mixture (1/3 of magenta color and 2/3 of cyan color) are represented, forming a layer with a thickness of 1 ROC, of a cyanish violet shade, with the mixture deposited onto a transparent acetate 52.

By applying the values obtained for black color volume equivalent, as listed in Table I for magenta color with a 50% density and cyan color with a 25% density, it is obtained:

$$V \text{ magenta} = 250.0 \times 1/3 = 83.3333$$
$$V \text{ cyan} = 62.5 \times 2/3 = 41.6667$$
$$V \text{ (magenta + cyan)} = \overline{125.0}$$

By applying Equation II to calculate the shade or density of the mixture of magenta and cyan colors, it is obtained:

$$T = (10 \times 125)^{1/2} = 35.355\%$$

Thus a geometrical pattern of uniform layer and density is obtained equivalent in volume to a parallelepiped with a density of 35.355% for the bichromatism (A), i. e., the amount of light retained is 35.355% and, accordingly, the amount of light incident on the transparent acetate 52 which passed through the latter is 64.645%.

Figure 6:
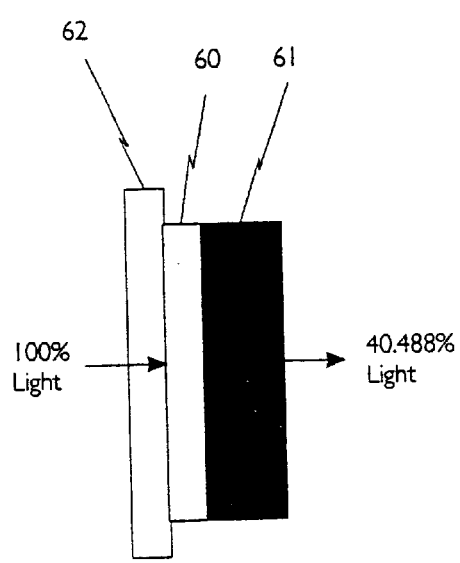
FIGS. 6 and 7 represent the physical qualities that a mixture of magnetism red and cyanish green colors must have in order to obtain a bichromatism (B), with 59.512% and 47.871% densities, respectively.

According to Table V, in FIG. 6 the physical qualities of the primary colors yellow 60 and magenta 61 mixture (1/3 of yellow color and 2/3 of magenta color) are represented, forming a layer with a thickness of 1 ROC, of a magentish red shade, with the mixture deposited onto a transparent acetate 62.

By applying the values obtained for black color volume equivalent, as listed in Table I for yellow color with a 75% density and magenta color with a 50% density, it is obtained:

$$V \text{ yellow} = 562.5 \times 1/3 = 187.50$$
$$V \text{ magenta} = 250.0 \times 2/3 = 166.6667$$
$$V \text{ (yellow + magenta)} = \overline{354.1667}$$

By applying Equation II to calculate the shade or density of the mixture of colors yellow and magenta, it is obtained:

$$T = (10 \times 354.1667)^{1/2} = 59.512\%$$

Thus a geometrical pattern of uniform layer and density is obtained, equivalent in volume to a parallelepiped with a density of 59.512% for said bichromatism (B), i. e. the amount of light retained is 59.512% and, accordingly, the amount of the light incident on the transparent acetate 62 which passed through the latter is 40.488%.

Figure 7:
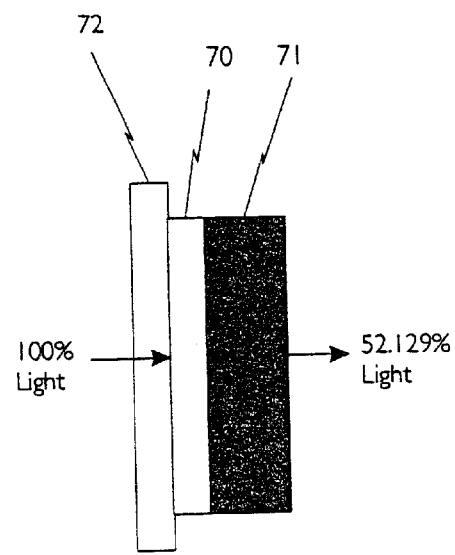

According to Table V, in FIG. 7 the physical qualities of the primary colors yellow 70 and cyan 71 mixture (⅓ of yellow color and ⅔ of cyan color) are represented, forming a layer with a thickness of 1ROC, of a cyanish green shade, with the mixture deposited onto a transparent acetate 72.

By applying the values obtained for black color volume equivalent, as listed in Table I for yellow color with a 75% density and cyan color with a 25% density, it is obtained:

$$\begin{aligned} V \text{ yellow} &= 562.5 \times 1/3 &= 187.50 \\ V \text{ cyan} &= 62.5 \times 2/3 &= 41.6667 \\ V \text{ (yellow + magenta)} & &= \overline{229.1667} \end{aligned}$$

Upon application of Equation II to calculate the shade or density of the mixture of yellow and cyan colors, it is obtained:

$$T = (10 \times 229.1667)^{1/2} = 47.871\%$$

Thus, a geometrical pattern of uniform layer and density is obtained, equivalent in volume to a paralleliped with a density of 47.871% for said bichromatism (B); i. e., the amount of light retained thereon is 47.871% and, accordingly, the amount of the light incident on said transparent acetate 72 which passed through the latter is 52.129%.

According to Table VI, in FIG. 8 the physical qualities of the primary colors cyan 80 and yellow 81 mixture (⅓ of cyan color and ⅔ of yellow color) are represented, forming a layer with a thickness of 1 ROC, of a yellowish green shade, with the mixture deposited onto a transparent acetate 82.

By applying the values obtained for black color volume equivalent, as listed in Table I for cyan color with a 25% density and yellow color with a 75% density, it is obtained:

$$\begin{aligned} V \text{ cyan} &= 62.5 \times 1/3 &= 20.8333 \\ V \text{ yellow} &= 562.5 \times 2/3 &= 375.0 \\ V \text{ (cyan + yellow)} & &= \overline{395.8333} \end{aligned}$$

Upon application of Equation II to calculate the shade or density of the mixture of cyan and yellow colors, it is obtained:

$$T = (10 \times 395.8323)^{1/2} = 62.915\%$$

Thus, a geometrical pattern of uniform layer and density is obtained, equivalent in volume to a paralleliped with a density of 62.915% for said bichromatism (C); i. e., the amount of light retained thereon is 62.915% and, accordingly, the amount of the light incident on said transparent acetate 82 which passed through the latter is 37.085%.

According to Table VI, in FIG. 9 the physical qualities of the primary colors cyan 90 and magenta 91 mixture (⅓ of cyan color and ⅔ of magenta color) are represented, forming a layer with a thickness of 1 ROC, of a magentish violet shade, with the mixture deposited onto a transparent acetate 92.

By applying the values obtained for black color volume equivalent, as listed in Table I for cyan color with a 25% density and magenta color with a 50% density, it is obtained:

$$\begin{aligned} V \text{ cyan} &= 62.5 \times 1/3 &= 20.8333 \\ V \text{ magenta} &= 250.0 \times 2/3 &= 166.6667 \\ V \text{ (cyan + magenta)} & &= \overline{187.5} \end{aligned}$$

Upon application of Equation II to calculate the shade or density of the mixture of cyan and magenta colors, it is obtained:

$$T = (10 \times 187.5)^{1/2} = 43.301\%$$

Thus, a geometrical pattern of uniform layer and density is obtained, equivalent in volume to a paralleliped with a density of 43.301% for said bichromatism (C); i. e., the amount of light retained thereon is 43.301 and, accordingly, the amount of light incident on said transparent acetate 92 which passed through the latter is 56.699%.

With the thus obtained shade or density values formulations are prepared for positive films, as required to obtain a trichromatism, and also to obtain said bichromatism (A), (B) and (C). The density values obtained for both primary colors and the mixture thereof provides for the balance of both the primary colors and the mixtures of primary colors.

In Table VII are shown the positive film formulations to obtain a trichromatism according to the principles of the present invention.

Said film formulations represent the densities of positive film previously obtained by applying said Equation (I), capable of automatically separating the primary colors yellow, magenta and cyan in black and white or color photography.

TABLE VII

POSITIVE FILM FORMULATION FOR TRICHROMATISM

| Color | Density | Emulsion | Vehicle |
|---|---|---|---|
| Yellow | 75% | 9/16 | 7/16 |
| Magenta | 50% | 4/16 | 12/16 |
| Cyan | 25% | 1/16 | 15/16 |

Figure 10:
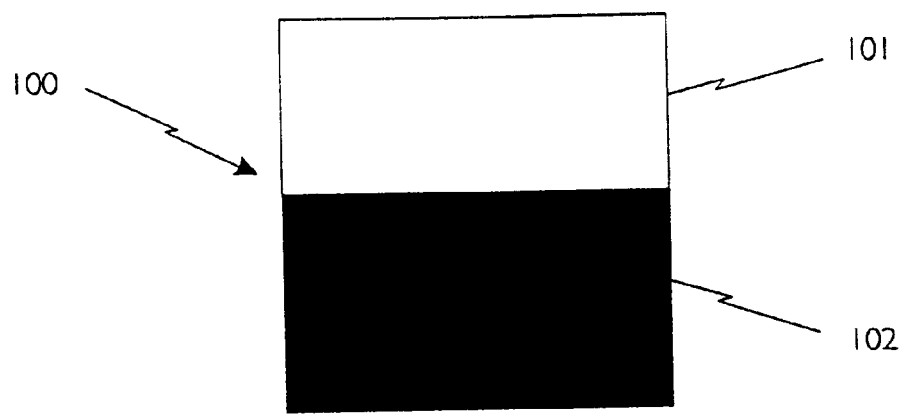
FIG. 10 represents the density of a positive film which automatically separates the yellow color in a black and white or color photography.
Figure 11:
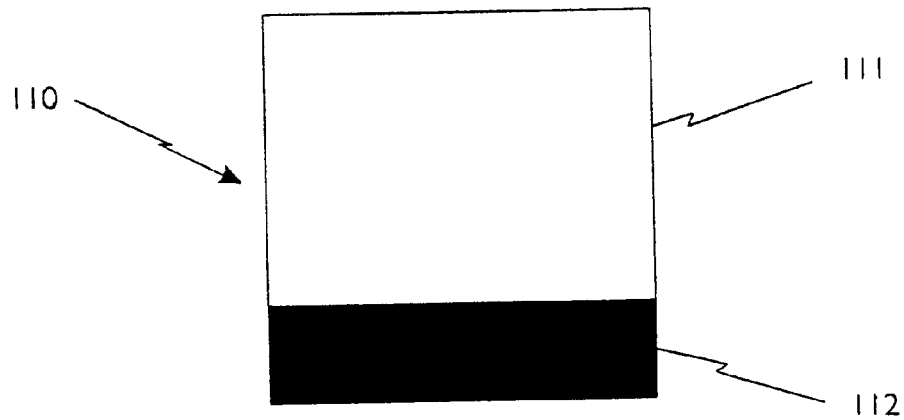
FIG. 11 represents the density of a positive film which automatically separates the cyan color in a black and white or color photography.
Figure 12:
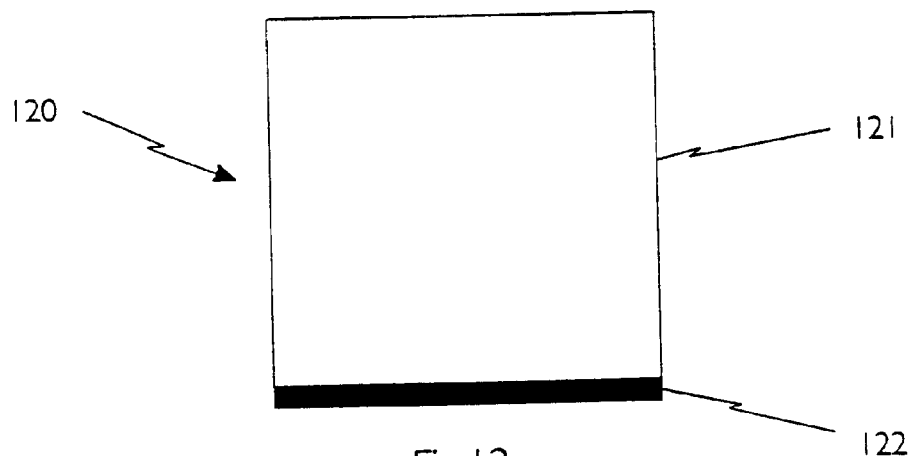
FIG. 12 represents the density of a positive film which automatically separates the cyan color in a black and white or color photography.

In FIGS. 10, 11 and 12 the densities of the positive film are represented, suitable to automatically separate the yellow, magenta and cyan colors, respectively, in a black and white or color photography.

FIG. 10 represents a 75% density film 100, corresponding to yellow as represented in FIG. 1, prepared with a mixture of 7/16 vehicle 101 plus 9/16 emulsion 102.

FIG. 11 represents a 50% density film 110, corresponding to magenta as represented in FIG. 2, prepared with a mixture of 12/16 vehicle 111 plus 4/16 emulsion 112.

FIG. 12 represents a 25% density film 120, corresponding to cyan as represented in FIG. 3, prepared with a mixture of 15/16 vehicle 121 plus 1/16 emulsion 122.

As for the formulations of positive film for bichromatism (A), (B) and (C), these are obtained as per the hereinbelow discussed:

In order to obtain a positive film formulation for yellowish red shade of the bichromatism "A", the yellow volume (⅔ volume) is multiplied by the corresponding black color volume equivalent (9/16), and the magenta volume (⅓ volume) is multiplied by the corresponding black color equivalent (4/16).

The thus obtained values are summed up and the result is complemented with an amount of vehicle, whereby one formulation unit can be obtained for a film according to the following:

```
Yellow 2/3 volume×9/16   = 18/48 =  9/24
Magenta 1/3 volume×4/16  =  4/48 =  2/24
              Emulsion            11/24
              Vehicle             13/24
```

In order to obtain the positive film formulation for cyanish violet shade in the bichromatism "A", the volume of magenta (1/3 volume) is multiplied by the corresponding black color equivalent (4/16) and the cyan volume (2/3 volume) is multiplied by the corresponding black color equivalent (1/16).

The thus obtained values are summed up and the result is complemented with a vehicle amount, whereby a unit of film formulation can be obtained, according to the following:

```
Magenta 1/3 volume×4/16 = 4/48 = 2/24
Cyan, 2/3 volume×1/16   = 2/48 = 1/24
              Emulsion           3/24
              Vehicle           21/24
```

In order to obtain the positive film formulation for magentish red shade in the bichromatism "B", the volume of yellow (1/3 volume) is multiplied by the corresponding black color equivalent (9/16) and the magenta volume (2/3 volume) is multiplied by the corresponding black color equivalent (4/16).

The thus obtained values are summed up and the result is complemented with a vehicle amount, whereby a unit of film formulation can be obtained, according to the following:

```
Yellow 1/3 volume×9/16    9/48
Magenta 2/3 volume×4/16   8/48
              Emulsion   17/48
              Vehicle    31/48
```

In order to obtain the positive film formulation for cyanish green shade in the bichromatism "B", the volume of yellow (1/3 volume) is multiplied by the corresponding black color equivalent (9/16) and the cyan volume (2/3 volume) is multiplied by the corresponding black color equivalent (1/16).

The thus obtained values are summed up and the result is complemented with a vehicle amount, whereby a unit of film formulation can be obtained, according to the following:

```
Yellow 1/3 volume×9/16   9/48
Cyan, 2/3 volume×1/16    2/48
              Emulsion  11/48
              Vehicle   37/48
```

In order to obtain the positive film formulation for yellowish green shade in the bichromatism "C", the volume of yellow (2/3 volume) is multiplied by the corresponding black color equivalent (9/16) and the cyan volume (1/3 volume) is multiplied by the corresponding black color equivalent (1/16).

The thus obtained values are summed up and the result is complemented with a vehicle amount, whereby a unit of film formulation can be obtained, according to the following:

```
Yellow 2/3 volume×9/16   18/48
Cyan, 1/3 volume×1/16     1/48
              Emulsion   19/48
              Vehicle    29/48
```

In order to obtain the positive film formulation for magentish violet shade in the bichromatism "C", the volume of magenta (2/3 volume) is multiplied by the corresponding black color equivalent (4/16) and the cyan volume (1/3 volume) is multiplied by the corresponding black color equivalent (1/16).

The thus obtained values are summed up and the result is complemented with a vehicle amount, whereby a unit of film formulation can be obtained, according to the following:

```
Magenta 2/3 volume×4/16   8/48
Cyan, 1/3 volume×1/16     1/48
              Emulsion    9/48
              Vehicle    39/48
```

In Table VIII positive film formulations for the bichromatism (A) are shown. Said formulations represent the positive film densities capable of automatically separating the yellowish red and cyanish violet colors in a black and white or color photography.

TABLE VIII

POSITIVE FILM FORMULATION FOR THE BICHROMATISM "A"

| Color | Density | Emulsion | Vehicle |
| --- | --- | --- | --- |
| Yellowish Red | 67.7% | 11/24 | 13/24 |
| Cyanish violet | 35.35% | 3/24 | 21/24 |

Figure 13:
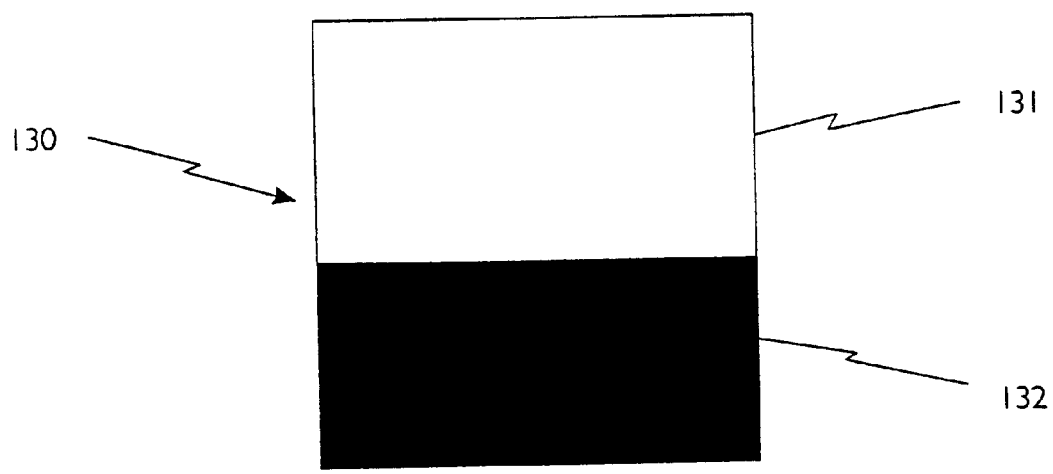
FIGS. 13 and 14 represent the densities of a positive film which automatically separates the yellowish red and cyanish violet colors corresponding to bichromatism (A), in a black and white or color photography.
Figure 14:
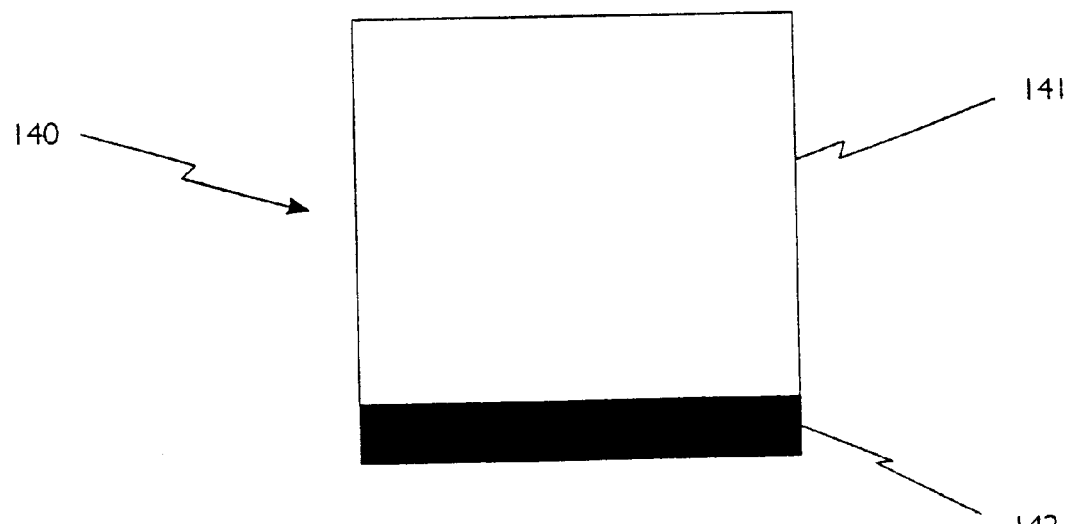

FIGS. 13 and 14 correspond to the bichromatism "A" and represent the positive film densities capable of automatically separate the yellowish red and cyanish violet colors, respectively, in a black and white or color photography.

FIG. 13 represent a film 130 with a 67.7% density, corresponding to the yellowish red represented in FIG. 4, and is prepared with a mixture of 13/24 vehicle 131 plus 11/24 emulsion 132.

FIG. 14 represents a film 140 with 35.35% density corresponding to cyanish violet represented in FIG. 5, and is prepared with a mixture of 21/24 vehicle 141 plus 3/24 emulsion 142.

In Table IX the positive film formulations are shown for the bichromatism (B). These formulations represent the positive film densities capable of automatically separating the magentish red and cyanish green colors in a black and white or color photography.

TABLE IX

POSITIVE FILM FORMULATION FOR THE BICHROMATISM "B"

| Color | Density | Emulsion | Vehicle |
| --- | --- | --- | --- |
| Magentish red | 59.51% | 17/48 | 31/48 |
| Cyanish green | 47.87% | 11/48 | 37/48 |

Figure 15:
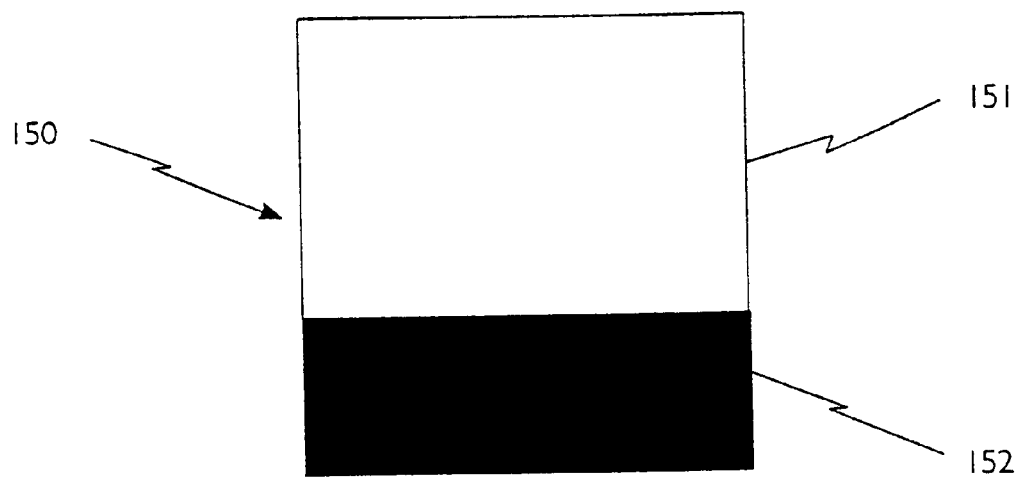
FIGS. 15 and 16 represent the densities of a positive film which automatically separates the magentish red and cyanish green colors, corresponding to bichromatism (B) in a black and white or color photography.
Figure 16:
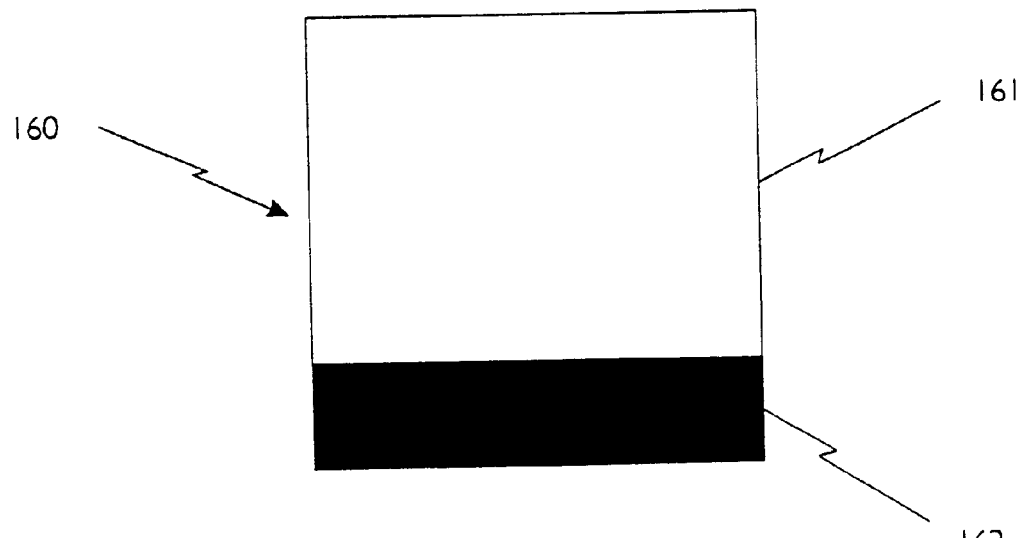

FIGS. 15 and 16 correspond to the bichromatism (B) and represent the densities of positive film capable of automatically separate the magentish red and cyanish green colors, respectively, in a black and white or color photography.

FIG. 15 represents a film 150 with a 59.51% density, corresponding to the magentish red represented in FIG. 6, and prepared with a mixture $^{31}/_{48}$ of vehicle 151 plus $^{17}/_{48}$ of emulsion 152.

FIG. 16 represents a film 160 with a 47.87% density, corresponding to cyanish green represented in FIG. 7, and prepared with a mixture $^{37}/_{48}$ of vehicle 161 and $^{11}/_{48}$ of emulsion 162.

In Table X the positive film formulations are shown for the bichromatism (C). These formulations represent the densities for positive film capable of automatically separate the yellowish green and magentish violet colors in a black and white or color photography.

TABLE X

POSITIVE FILM FORMULATION FOR THE BICHROMATISM "C"

| COLOR | DENSITY | EMULSION | VEHICLE |
|---|---|---|---|
| Yellowish green | 62.92% | $^{19}/_{48}$ | $^{29}/_{48}$ |
| Magentish violet | 43.30% | $^{9}/_{48}$ | $^{39}/_{48}$ |

Figure 17:
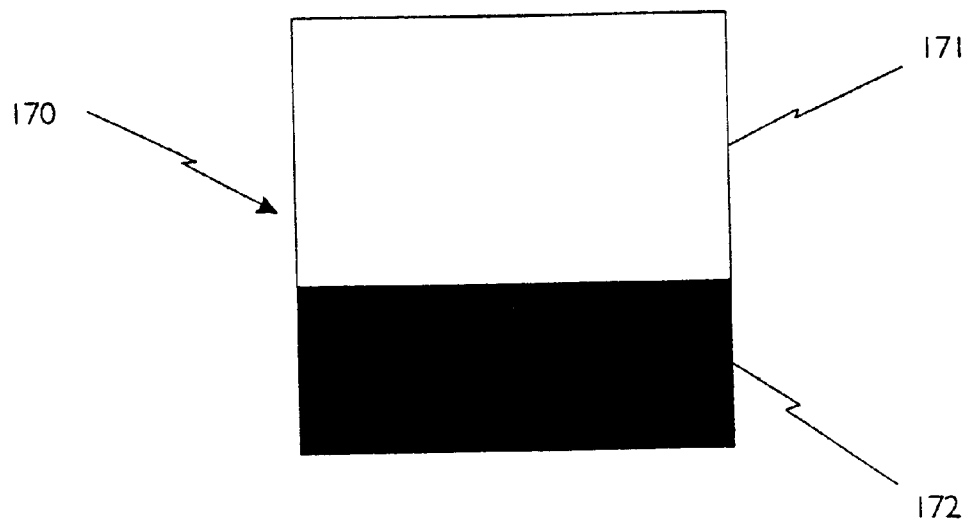
FIGS. 17 and 18 represent the densities of a positive film which automatically separates the yellowish green and magentish violet colors, corresponding to bichromatism (C), in a black and white or color photography.
Figure 18:
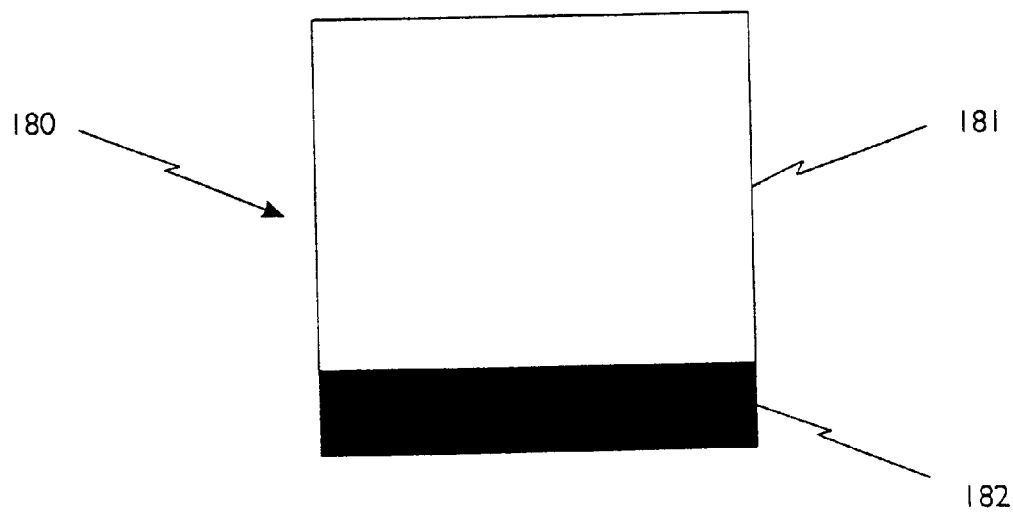

FIGS. 17 and 18 correspond to the bichromatism (C) and represent the positive film densities capable of automatically separate the yellowish green and magentish violet colors, respectively, in a black and white or color photography.

FIG. 17 represent a film 170 with a 62.92% density corresponding to the yellowish green represented in FIG. 8, and prepared with a $^{29}/_{48}$ mixture of vehicle 171 plus $^{19}/_{48}$ of emulsion 172.

FIG. 18 represents a film 180 with 43.30% density, corresponding to the magentish violet represented in FIG. 9 and prepared with a mixture $^{39}/_{48}$ of vehicle 181 plus $^{9}/_{48}$ of emulsion 182.

Figure 19:
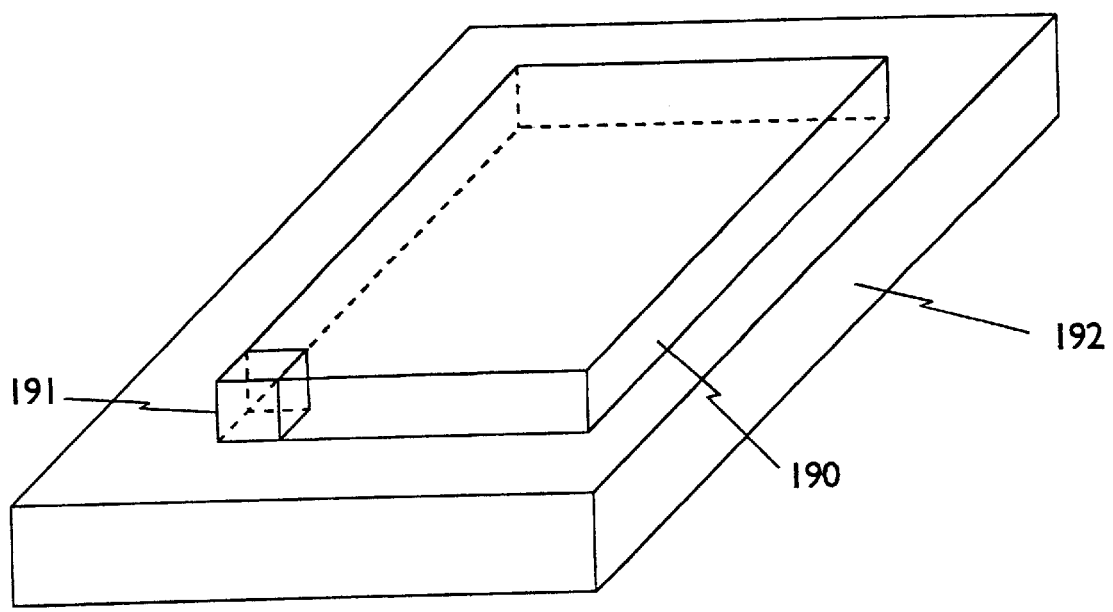
FIG. 19 represents the schematization of the color volumetric unit, the height or thickness of which is 1 ROC.

On the other side, in FIG. 19 the color volumetric unit is shown with a 1 ROC thickness or height, being a cube contained in the paint layer exhibiting a surface to 100% the shade of the paint used.

In FIG. 19 the schematized paint layer 190 contain 60 cubes with 1 ROC edge.

The volumetric color unit is a cube 191 with the characteristic that, when seated on any of its six faces over a white surface 192, will exhibit a surface of 1 ROC×1 ROC to 100% the shade and contains a volume of 1 ROC×1 ROC×1 ROC of the paint being used.

Although the above has illustrated and described specific embodiments of this invention, it is to be pointed out that a number of modifications are possible in said embodiments without become out of the true scope of the invention.

Therefore, this invention should not be restricted except for the requirements of the prior art and the spirit of the appended claims.

What is claimed is:

1. Positive film compositions for obtaining color selection, wherein said compositions comprise an emulsion sensitive to any type of light and a photographically accepted vehicle having physical properties which permit a color selection for establishing a trichromatism.

2. Positive film compositions for obtaining color selection, according to claim 1, wherein for said trichromatism previously balanced primary colors are employed.

3. Positive film compositions for obtaining color selection, according to claim 2, wherein the balanced yellow color has a 75% density.

4. Positive film compositions for obtaining color selection, according to claim 2, wherein the balanced magenta color has a 50% density.

5. Positive film compositions for obtaining color selection, according to claim 2, wherein the balanced cyan color has a 25% density.

6. Positive film compositions for obtaining color selection, according to claim 2, wherein, in order to establish a trichromatism the following is employed: a) a positive film composition comprising $^{9}/_{16}$ of emulsion and $^{7}/_{16}$ of vehicle for balanced yellow color; b) a positive film composition comprising $^{1}/_{4}$ of emulsion and $^{3}/_{4}$ of vehicle, for balanced magenta color, and c) a positive film composition comprising $^{1}/_{16}$ of emulsion and $^{15}/_{16}$ of vehicle for balanced cyan color.

7. A method of obtaining positive film compositions to make a color selection, wherein said compositions comprise an emulsion sensitive to any type of light and a photographically accepted vehicle, having physical properties which permit a color selection for establishing trichromatism, in order to obtain a trichromatism, said method comprises: a) determining the gray color equivalent for each of the three primary colors; and b) obtaining the amounts of emulsion and vehicle corresponding for every primary color.

8. A method of obtaining positive film compositions to make a color selection, according to claim 7, wherein, in order to determine the gray color equivalent for each of the three primary colors, the volume of black color equivalent is calculated in a first step, retaining 25% of the light for cyan color, the volume of black color equivalent retaining 50% of the light for magenta color, and the volume of black color equivalent retaining 75% of light for yellow color, by applying the equation:

$$V = \frac{T2}{10} \qquad (I)$$

wherein:

T=the color shade or density in percentage (%); and

V=the color volume in volumetric units;

once the black color volumes have been obtained for every primary color, each black color volume is complemented with the white color volume required to obtain a 100% volume; with the volumes of black color and white color thus found corresponding, upon mixing the same, to the gray colors equivalent for every primary color.

9. A method of obtaining positive film compositions to make a color selection, according to claim 8, wherein, in order to obtain the amounts of emulsion and vehicle corresponding to each of the primary colors, the volumes of black color (emulsion) and white color (vehicle) previously calculated are converted into fractional numbers so as to express the positive film composition corresponding to every primary color.

* * * * *